United States Patent [19]

Shinomiya

[11] Patent Number: 4,957,882
[45] Date of Patent: Sep. 18, 1990

[54] METHOD FOR MANUFACTURING SEMICONDUCTOR DEVICE

[75] Inventor: Kohji Shinomiya, Itami, Japan

[73] Assignee: Mitsubishi Denki Kabushiki Kaisha, Japan

[21] Appl. No.: 320,498

[22] Filed: Mar. 8, 1989

[30] Foreign Application Priority Data

Nov. 25, 1988 [JP] Japan .................... 63-295996

[51] Int. Cl.⁵ ............... H01L 23/15; H01L 31/203
[52] U.S. Cl. .................... 437/209; 437/927; 264/272.17
[58] Field of Search .................... 437/209, 927; 264/272.17

[56] References Cited

FOREIGN PATENT DOCUMENTS

| 60-63941 | 4/1985 | Japan | 437/209 |
|---|---|---|---|
| 60-113934 | 6/1985 | Japan | 437/209 |
| 60-154534 | 8/1985 | Japan . | |
| 62-11240 | 1/1987 | Japan | 437/209 |
| 62-90938 | 4/1987 | Japan | 437/209 |
| 64-25428 | 1/1989 | Japan | 437/209 |

OTHER PUBLICATIONS

Kondoh et al., "The Development of the Molded Cavity Package with Optical Window", 37th Electronic Components Conference, Jul. 25, 1987.

Primary Examiner—Brian E. Hearn
Assistant Examiner—Andrew Griffis
Attorney, Agent, or Firm—Leydig, Voit & Mayer

[57] ABSTRACT

Disclosed is a method for manufacturing a semiconductor device having a semiconductor chip with a light receiving element disposed in a surface of the semiconductor chip, and a light transmission window having a first surface facing the light receiving element and a second surface generally parallel to the first surface and for protecting the light receiving element. One of two liquid agents constituting a two-part adhesive is applied to the surface of the semiconductor chip so that the liquid agent surrounds the light receiving element, and the other of the liquid agents of the two-part adhesive is applied to the first surface of the light transmission window in correspondence with the former liquid agent. These liquid agents are brought into contact with each other to fix the light transmission window to the semiconductor chip. The semiconductor chip and part of the light transmission window is then resin-molded so that the second surface of the light transmission window is exposed.

8 Claims, 4 Drawing Sheets

METHOD FOR MANUFACTURING SEMICONDUCTOR DEVICE

BACKGROUND OF THE INVENTION

1. Field of the Invention

This invention relates to a method for manufacturing a semiconductor device and, more particularly, to a method for fixing a light transmission window to a semiconductor chip incorporating a light receiving element.

2. Description of the Related Art

FIG. 6 shows the structure of a typical example of a type of semiconductor device which has a semiconductor chip incorporating a light receiving element. A lower surface 2b of a semiconductor chip 2 which constitutes an integrated circuit is mounted on a die pad 11 of a lead frame 1. A light receiving element 21 is embedded in an upper surface 2a of the semiconductor chip 2 at the center thereof in such a manner that its upper surface is exposed. A peripheral wall 3 is formed on the upper surface 2a of the semiconductor chip 2 surrounding the outer periphery of the light receiving element 21. A light transmission window 4 is placed on the peripheral wall 3 in order to protect the light receiving element 21. The light transmission window 4 may have predetermined spectral characteristics depending upon the purpose of the semiconductor device. A plurality of bonding pads 5 are formed along the periphery of the upper surface 2a of the semiconductor chip 2. The bonding pads 5 are connected electrically to inner lead portions of corresponding leads 12 of the lead frame 1 by means of bonding wires 6. The semiconductor chip 2, the peripheral wall 3, side portions of the light transmission window 4, the bonding wires 6, the die pad 11 of the lead frame 1 and the inner lead portions of the leads 12 are molded with a resin 7 while an upper surface 4a of the light transmission window 4 is exposed.

This semiconductor device is manufactured as described below. First, the peripheral wall 3 is formed on the upper surface 2a of the semiconductor chip 2 from a silicone or the like between the central light receiving element 21 and the plurality of outer-peripheral bonding pads 5 encircling the light receiving element 21. The light transmission window 4 is placed on the peripheral wall 3 so that an enclosed space 8 is formed between a lower surface 4b of the light transmission window 4 and the upper surface 2a of the semiconductor chip 2. The enclosed space 8 is provided in order to prevent the resin from entering the gap between the light receiving element 21 and the light transmission window 4 during molding and to prevent the semiconductor chip 2 and/or the light transmission window 4 from warping owing to the difference between thermal expansion coefficients of these components when the semiconductor device receives a thermal shock.

After die bonding of the lower surface 2b of the semiconductor chip 2 to the die pads 11 of the lead frame 1, the bonding pads 5 formed in the upper surface 2a of the semiconductor chip 2 and the inner lead portions of the corresponding leads 12 of the lead frame 1 are electrically connected to each other with the bonding wires 6. Then, the lead frame 1 is set in a die (not shown) and the resin 7 is injected into this die, thereby resin-molding the semiconductor chip 2, the peripheral wall 3, side portions of the light transmission window 4, the bonding wires 6, the die pad 11 of the lead frame 1 and the inner lead portions of the leads 12 so that only the upper surface 4a of the light transmission window 4 and outer lead portions of the leads 12 are exposed.

In the thus-manufactured semiconductor device, external light introduced to the exposed surface 4a of the light transmission window 4 passes through the light transmission window 4 and reaches the light receiving element 21 where the light is converted into electricity.

In the conventional semiconductor device, however, there is a risk that the position of the light transmission window 4 may shift under the pressure at which the resin 7 is injected into the die or a risk that the resin 7 will enter the enclosed space 8 during molding, because the resin molding is performed while the light transmission window 4 is in place on the peripheral wall 3, as described above. For this reason, it is necessary to perform resin molding while pressing the light transmission window 4 against the peripheral wall 3. It is also necessary that the pressure at which the resin 7 is injected be controlled in relation to the force with which the light transmission window 4 is pressed against the peripheral wall 3. Thus, there are complicated manufacturing conditions of relating the molding. It is therefore difficult to manufacture the semiconductor device with high accuracy and the desired stability.

SUMMARY OF THE INVENTION

In view of this problem, it is an object of the present invention to provide a method for manufacturing, with high accuracy and the desired stability, a semiconductor device having a semiconductor chip incorporating a light receiving element.

To this end, the present invention provides a method for manufacturing a semiconductor device having a semiconductor chip with a light receiving element disposed in a surface of the semiconductor chip, and a light transmission window for protecting the light receiving element, the light transmission window having a first surface facing the light receiving element and a second surface generally parallel to the first surface, the method including the steps of: applying a first of two liquid agents constituting a two-part adhesive to the surface of the semiconductor chip so that the first liquid agent surrounds the light receiving element; applying the second of the liquid agents of the two-part adhesive to the first surface of the light transmission window at a location corresponding to the first liquid agent applied to the semiconductor chip; fixing the semiconductor chip and the light transmission window to each other by bringing the first and second liquid agents into contact with each other; and resin-molding the semiconductor chip and part of the light transmission window so that the second surface of the light transmission window is exposed.

DESCRIPTION OF THE PREFERRED EMBODIMENTS

Embodiments of the present invention will be described below with reference to the accompanying drawings.

Figure 1:
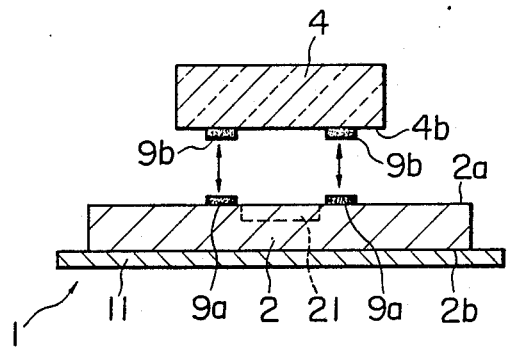
FIGS. 1 to 3 are cross-sectional views illustrating a semiconductor device manufacture method in accordance with the present invention.

Referring to FIG. 1, a light receiving element 21 is embedded in a central portion of an upper surface 2a of a semiconductor chip 2 which constitutes an integrated circuit. First, a first liquid agent 9a of two liquid agents which constitute a two-part adhesive is applied to the upper surface 2a of the semiconductor chip 2 in such a manner that it forms an annular shape surrounding the light receiving element 21. Similarly, a second liquid agent 9b of the two liquid agents is applied to a lower surface 4b of a light transmission window 4 made of glass or the like so that it forms an annular shape corresponding to that of the liquid agent 9a applied to the upper surface 2a of the semiconductor chip 2. At this time, the liquid agents 9a and 9b maintain their liquid states without setting since they do not contact each other. Also, they are sufficiently viscous that they maintain their annular shapes.

A lower surface 2b of the semiconductor chip 2 is then mounted on a die pad 11 of a lead frame 1.

Figure 2:
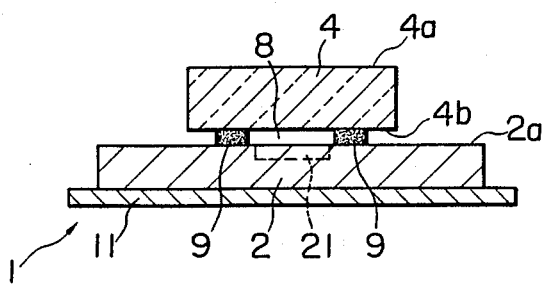

After the position of the light transmission window 4 has been adjusted so that the second liquid agent 9b in the annular form applied to the lower surface 4b of the light transmission window 4 is positioned directly opposite the liquid agent 9a applied to the upper surface 2a of the semiconductor chip 2, the light transmission window 4 is pressed against the upper surface 2a of the semiconductor chip 2 to bring the liquid agents 9a and 9b into contact with each other, as shown in FIG. 2. The liquid agents 9a and 9b are thereby mixed with each other and become a set adhesive 9 by chemical reaction so that the light transmission window 4 is fixed to the semiconductor chip 2. The thicknesses of the applied liquid agents 9a and 9b are chosen to form an enclosed space 8 between the lower surface 4b of the light transmission window 4 and the upper surface 2a of the semiconductor chip 2.

Figure 3:
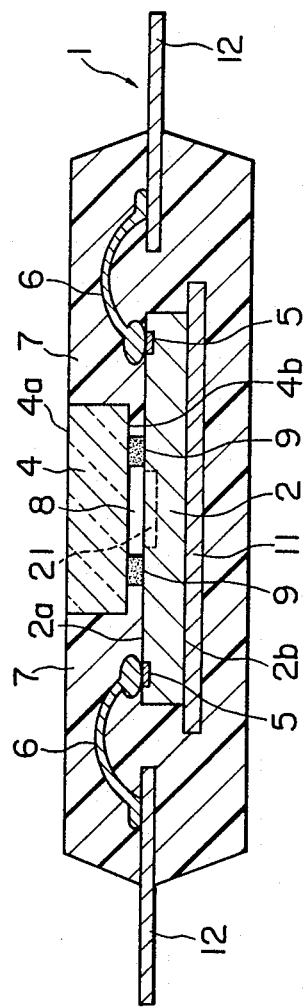

Thereafter, as shown in FIG. 3, wire bonding is effected between bonding pads 5 formed along the periphery of the upper surface 2a of the semiconductor chip 2 and the inner lead portions of the corresponding leads 12 of the lead frame 1 using bonding wires 6, thereby electrically connecting the bonding pads 5 to the leads 12.

Then, the lead frame 1 is set in a die (not shown) together with the semiconductor chip 2 and the light transmission window 4. A resin 7 is thereafter injected into this die, thereby resin-molding the semiconductor chip 2, side portions of the light transmission window 4, the bonding wires 6, the die pad 11 of the lead frame 1 and the inner lead portions of the leads 12 so that only an upper surface 4a of the light transmission window 4 and outer lead portions of the leads 12 are exposed. At this time, the light transmission window 4 has already been fixed to the semiconductor chip 3 by the set adhesive 9. Therefore there is no need to press the light transmission window 4 against the semiconductor chip 2 during injection of the resin 7. Also, the need for fine adjustment of the pressure at which the resin 7 is injected into the die is eliminated. Thus, the molding process can easily be controlled.

In the above-described embodiment, the light transmission window 4 is fixed to the semiconductor chip 2 after the semiconductor chip 2 to which the liquid agent 9a has been applied is bonded to the die pad 11 of the lead frame 1. The procedure in accordance with the present invention is not so limited, and the semiconductor chip 2 may be bonded to the die pad 11 after the light transmission window 4 has been fixed to the semiconductor chip 2. It is also possible to apply the liquid agent 9a to the semiconductor chip 2 after the die bonding of the semiconductor chip 2 to the die pad 11.

Figure 4:
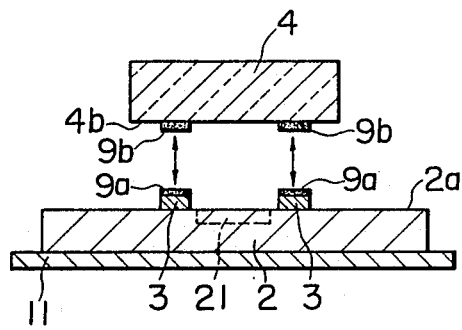
FIGS. 4 and 5 are cross sectional views illustrating additional embodiments of the present invention.
Figure 5:
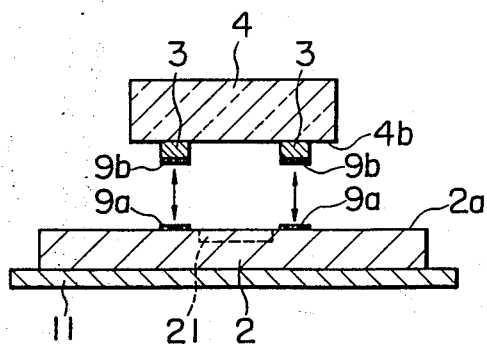
Figure 6:
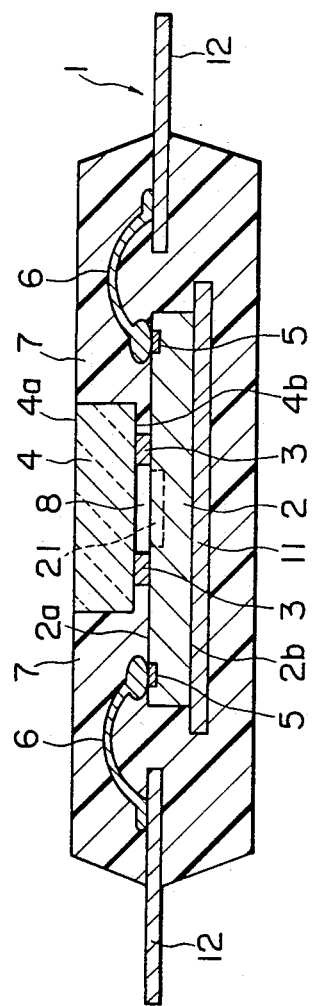
FIG. 6 is a cross-sectional view of the structure of an ordinary semiconductor device which has a semiconductor chip incorporating a light receiving element.

FIGS. 4 and 5 show other embodiments of the present invention.

In the embodiment of FIG. 4, an annular peripheral wall 3 of a silicone or the like is previously formed on the upper surface 2a of the semiconductor chip 2 surrounding the light receiving element 21, followed by application of the liquid agent 9a of the two-part adhesive to the upper surface of the peripheral wall 3. Similarly, as shown in FIG. 5, the peripheral wall 3 may be previously formed on the lower surface 4b of the light transmission window 4, followed by application of the other liquid agent 9b of the two-part adhesive to the lower surface of the peripheral wall 3. Since, in the arrangements shown in FIGS. 4 and 5, the peripheral wall 3 is previously formed and the two-part adhesive is not used to form any wall in place of the peripheral wall 3, the thickness of each of the applied liquid agents 9a and 9b can be adjusted as desired irrespective of the distance between the window 4 and the semiconductor chip 2.

Epoxy adhesives may be used as the two-part adhesives. For instance, an epoxy resin intermediate such as epichlorohydrin bisphenol is used as the liquid agent 9a while polyamide amine or polythiol is used as the liquid agent 9b. Of course, these liquid agents 9a and 9b may be interchanged with each other. That is, the liquid agent 9b may be applied to the semiconductor chip 2 while the liquid agent 9a is applied to the light transmission window 4.

The liquid agents 9a and 9b can be applied in various ways such as a screen printing method, a stamping method, a mechanical method and the like. Specifically, in the case of application by screen printing, a thixotropic type of resinous adhesive may be used for ease of application. In the process of application of the liquid agent to the semiconductor chip 2, the agent may be applied by screen printing simultaneously on a multiplicity of semiconductor chips 2 at the stage where the chips are formed on a wafer, the wafer being divided to separate the semiconductor chips 2 after the application of the liquid agent.

In accordance with the present invention, since, as described above, the liquid agents constituting the two-part adhesive are respectively applied to the semiconductor chip 2 and the light transmission window 4, setting of the adhesive progresses very little before the agents are mixed. Consequently, it is possible to perform application of the liquid agents to the semiconductor chip 2 and the light transmission window 4 and positioning of the light transmission window 4 relative to the semiconductor chip 2 with high accuracy by spending sufficient time, thus enabling manufacture of desired products, that is, semiconductor devices with high accuracy. In addition, the two-part adhesive can be easily stored and handled since the adhesive does not set as long as the liquid agents are separated from each other.

What is claimed is:

1. A method for manufacturing a semiconductor device having a semiconductor chip with a light receiving element disposed in a surface of said semiconductor chip and a light transmission window for protecting said light receiving element, said light transmission window having a first surface facing said light receiving element and a second surface generally parallel to said first surface, said method comprising:

applying a first of first and second liquid agents comprising a two-part adhesive to a surface of a semiconductor chip in which is disposed a light receiving element to surround said light receiving element with said first liquid agent;

applying the second of said liquid agents of said two-part adhesive to a first surface of a light transmission window at a location corresponding to the first of said liquid agents as applied to said semiconductor chip;

fixing said semiconductor chip and said light transmission window to each other by bringing said first and second liquid agents into contact with each other; and molding said semiconductor chip in a resin without obscuring said second surface of said light transmission window with the resin.

2. A method according to claim 1 wherein said first and second liquid agents set by contacting each other including forming a space enclosed by the adhesive between said light receiving element and said light transmission window.

3. A method according to claim 1 including forming a peripheral wall on the surface of said semiconductor chip so that said peripheral wall surrounds said light receiving element and applying said first liquid agent to said peripheral wall.

4. A method according to claim 1 wherein said light transmission window has an annular peripheral wall formed on said first surface including applying said second liquid agent to said peripheral wall.

5. A method according to claim 1 wherein said two-part adhesive is an epoxy adhesive.

6. A method according to claim 1 including applying said first and second liquid agents by screen printing.

7. A method according to claim 1 including applying said first and second liquid agents by stamping.

8. A method according to claim 1 wherein said semiconductor chip has a plurality of bonding pads including mounting said semiconductor chip on a die pad of a lead frame having a plurality of leads, electrically connecting said leads with wires to said bonding pads, and resin-molding said semiconductor chip after electrically connecting the leads and bonding pads.

* * * * *